(12) United States Patent
Tapily et al.

(10) Patent No.: US 11,705,369 B2
(45) Date of Patent: Jul. 18, 2023

(54) FULLY SELF-ALIGNED VIA WITH SELECTIVE BILAYER DIELECTRIC REGROWTH

(71) Applicant: Tokyo Electron Limited, Tokyo (JP)

(72) Inventors: Kandabara Tapily, Mechanicville, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 53 days.

(21) Appl. No.: 17/223,831

(22) Filed: Apr. 6, 2021

(65) Prior Publication Data

US 2021/0249305 A1 Aug. 12, 2021

Related U.S. Application Data

(62) Division of application No. 16/453,473, filed on Jun. 26, 2019, now Pat. No. 11,031,287.

(Continued)

(51) Int. Cl.
*H01L 21/768* (2006.01)
*H01L 23/522* (2006.01)

(52) U.S. Cl.
CPC .. *H01L 21/76897* (2013.01); *H01L 21/76808* (2013.01); *H01L 21/76816* (2013.01); *H01L 21/76843* (2013.01); *H01L 23/5226* (2013.01)

(58) Field of Classification Search
CPC ......... H01L 21/76897; H01L 21/76808; H01L 21/76816; H01L 21/76843; H01L 23/5226;

(Continued)

(56) References Cited

U.S. PATENT DOCUMENTS 9,530,691 B1 * 12/2016 Zhang ............... H01L 21/67075
11,456,212 B2 * 9/2022 Clark ................ H01L 21/76849
(Continued)

FOREIGN PATENT DOCUMENTS

TW 201725606 A 7/2017

OTHER PUBLICATIONS

International Preliminary Report on Patentability and Written Opinion dated Dec. 29, 2020 in PCT/US2019/039260.
(Continued)

*Primary Examiner* — Su C Kim
(74) *Attorney, Agent, or Firm* — Oblon, McClelland, Maier & Neustadt, L.L.P.

(57) ABSTRACT

A semiconductor device includes conductive structures formed in a first dielectric layer, a conductive cap layer selectively positioned over the conductive structures and the first dielectric layer with a top surface and sidewalls, a second dielectric layer selectively positioned over the first dielectric layer and disposed between the sidewalls of the conductive cap layer, a third dielectric layer selectively positioned over the second dielectric layer and disposed between the sidewalls of the conductive cap layer, a fourth dielectric layer arranged over the conductive structures and the third dielectric layer, and an interconnect structure formed in the fourth dielectric layer. The interconnect structure includes a trench structure and a via structure that is positioned below the trench structure and connected to the trench structure. The via structure includes a first portion positioned over the conductive cap layer and a second portion disposed over the first portion and the third dielectric layer.

12 Claims, 8 Drawing Sheets

Related U.S. Application Data

(60) Provisional application No. 62/690,838, filed on Jun. 27, 2018.

(58) Field of Classification Search
CPC ........ H01L 21/76832; H01L 21/76849; H01L 21/76829; H01L 21/0274; H01L 21/76831; H01L 21/76834; H01L 21/76846; H01L 21/7685
See application file for complete search history.

(56) References Cited

U.S. PATENT DOCUMENTS

| | | | |
|---|---|---|---|
| 2003/0148618 A1 | 8/2003 | Parikh | |
| 2006/0118962 A1 | 6/2006 | Huang | |
| 2010/0029071 A1* | 2/2010 | Russell | H01L 21/76859 438/514 |
| 2010/0038788 A1 | 2/2010 | Kim | |
| 2011/0021035 A1 | 1/2011 | Kwon | |
| 2012/0181694 A1 | 7/2012 | Usami | |
| 2016/0218034 A1 | 7/2016 | Zhang | |
| 2017/0110397 A1 | 4/2017 | Wu et al. | |
| 2017/0178949 A1 | 6/2017 | Nguyen | |
| 2019/0013332 A1 | 1/2019 | Lee | |

OTHER PUBLICATIONS

Combined Taiwanese Office Action and Search Report dated Feb. 3, 2023 in Patent Application No. 108122579 (with English language translation, 16 pages.

* cited by examiner

FULLY SELF-ALIGNED VIA WITH SELECTIVE BILAYER DIELECTRIC REGROWTH

CROSS REFERENCE TO RELATED APPLICATIONS

This application is a divisional of U.S. patent application Ser. No. 16/453,473 filed on Jun. 26, 2019, which claims the benefit of U.S. Provisional Application No. 62/690,838 filed Jun. 27, 2018. The entire contents of the above-identified applications are incorporated herein by reference in their entirety.

FIELD OF THE INVENTION

The invention relates to semiconductor micro fabrication including systems and processes for patterning, deposition, and removal of materials on a given substrate or wafer.

BACKGROUND

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to multiple-patterning (MP) methods, such as a double-patterning (DP) method to overcome optical limitations.

In material processing methodologies (e.g., photolithography), creating patterned layers includes application of a thin layer of radiation-sensitive material, such as photoresist, to an upper surface of a substrate. The thin layer of radiation-sensitive material is transformed into a relief pattern which can be used as an etch mask to transfer a pattern into an underlying layer on a substrate. Patterning of the thin layer of radiation-sensitive material generally involves an exposure process to actinic radiation through a reticle (and associated optics) onto the thin layer of radiation-sensitive material by using, for example, a photo-lithography system. The exposure process can then be followed by a removal of irradiated regions of the thin layer of radiation-sensitive material (as in a case of positive photoresist), or non-irradiated regions (as in a case of negative resist) by using a developing solvent. In some embodiments, the etch mask can further include multiple sub-layers.

Conventional lithographic techniques for exposing a pattern of radiation or light onto a substrate have various challenges that limit sizes of exposed features, and limit pitch or spacing between the exposed features. Various studies have been carried out to improve the conventional lithographic techniques. For example, a related technique to mitigate exposure limitations is applying a double patterning approach to allow the patterning of smaller features at a smaller pitch than what is currently possible with conventional lithographic techniques.

SUMMARY

As smaller devices are fabricated, a critical dimension (CD) or a resolution of patterned features is becoming more challenging to produce. On top of that concern, an additional challenge is associated with overlay between two photo-lithographic processes, such as photolithographic misalignment. If masks and patterns are not properly aligned, device defects and failures can occur. For example, lines can be either partially cut or not cut at desired locations, openings can be misplaced, or shorts can be otherwise created. Such a misalignment also brings challenges during metallization of substrates when multiple layers of metal lines and vias are interconnected with underlying transistors. Another challenge associated with the metallization is to create trenches and vias without damaging surrounding dielectric material.

Techniques (or methods) herein include methods for patterning substrates, such as forming patterns during metallization in back end of line (BEOL). Techniques herein enable fully self-aligned vias and lines. Techniques herein include using selective growth of bilayer dielectrics to enable self-alignment of trench and via patterning without using etch-stop layers or films with undesirable compositions. In the bilayer dielectric structures, a first dielectric layer can provide electric isolation from adjacent metal lines, while a second dielectric layer can prevent etching of the first dielectric during formation of trench and via patterning. Both the dielectric layers can be deposited in a same chamber and remain on the substrate within a wiring layer instead of being removed like most etch-stop layers.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a method for processing a substrate is provided. In the disclosed method, a substrate is provided. The substrate includes a first dielectric layer, and a plurality of conductive structures formed in the first dielectric layer. A top surface of the first dielectric layer is level with top surfaces of the conductive structures. A conductive cap layer is then formed over the conductive structures, where the conductive cap layer is selectively positioned over the conductive structures with a top surface and sidewalls. A second dielectric layer is subsequently formed over the first dielectric layer. The second dielectric layer is selectively positioned over the first dielectric layer so that the top surface of the conductive cap layer is exposed or uncovered, and the sidewalls of the conductive cap layer are in direct contact with the second dielectric layer After the second dielectric layer is selectively formed over the first dielectric layer, a third dielectric layer is formed over the second dielectric layer, where the third dielectric layer is selectively positioned over the second dielectric layer so that the top surface of the conductive cap layer is exposed or uncovered, and is lower than a top surface of the third dielectric layer. A fourth dielectric layer is then formed over the plurality of conductive structures and the third dielectric layer. An interconnect structure is subsequently formed within the fourth dielectric layer. The interconnect structure includes a via structure that has a first portion positioned over the conductive cap layer so that sidewalls of the first portion are in direct contact with the third dielectric layer, and a second portion disposed over the first portion and the third dielectric layer.

In some embodiments, the third dielectric layer can have an etch selectivity to the fourth dielectric layer such that an etching plasma can remove the fourth dielectric layer faster than remover the third dielectric layer. The third dielectric layer can be made of metal-containing dielectric material, or any dielectric material which has some degree of etch selectivity to the fourth dielectric layer.

In some embodiments, the conductive cap layer is selectively deposited on the plurality of conductive structures after the second dielectric layer is formed. In some embodiments, each of the conductive structures includes at least one of a via structure and a line structure. Further, the conductive cap layer can include at least one of ruthenium, tungsten, nickel, or cobalt. The third dielectric layer can be made of metal-containing dielectric material.

In some embodiments, a height of the second dielectric layer is at least twice as great as a height of the third dielectric layer. In some embodiments, the second dielectric layer and the third dielectric layer are formed in a same deposition chamber. In some embodiments, the conductive cap layer, the second and third dielectric layers are formed by using a common processing tool. The processing tool includes one or more chambers that are configured to form the conductive cap layer, the second dielectric layer and the third dielectric layer respectively.

In the disclosed method, an interconnect opening can be formed in the fourth dielectric layer, where the interconnect opening includes a trench opening and a via opening that is positioned below the trench opening and exposes one of the plurality of the conductive structures. A barrier layer (or liner) is formed to cover the interconnect opening and the exposed (or uncovered) one of the plurality of conductive structures. A conductive layer is subsequently formed over the barrier layer to fill the interconnect opening, where the conductive layer further covers a top surface of the fourth dielectric layer. A surface planarization process is performed to remove excessive conductive layer over the top surface of the fourth dielectric layer.

In some embodiments, the conductive layer can be formed through multiple approaches including (a) bottom-fill deposition in which the top of the conductive layer is level with the top surface of the fourth dielectric film, (b) a deposition of the conductive layer such that the resulting over-burden of the conductive layer relative to the fourth dielectric film is minimal and very uniform where either an etch-recess or surface planarization process can be performed to remove excessive conductive layer over the top surface of the fourth dielectric layer, or (c) a traditional deposition of the conductive layer where the conductive layer covers a top surface of the fourth dielectric layer where a surface planariazation process can be performed to remove excessive conductive layer over the top surface of the fourth dielectric layer In some embodiments, the third dielectric layer is configured to protect the second dielectric layer from the etching process when the interconnect opening is formed within the fourth dielectric layer. The height of the second dielectric layer is in a range from 3 nm to 15 nm so that the second dielectric layer prevents an electric short between the conductive structures and the interconnect structure.

According to another aspect of the disclosure, a semiconductor device is provided. In the disclosed device, a plurality of conductive structures are arranged in a first dielectric layer, where top surfaces of the plurality of the conductive structures and a top surface of the first dielectric layer are co-planar. In addition, a conductive cap layer is selectively positioned over the conductive structures with a top surface and sidewalls. A second dielectric layer is selectively positioned over the first dielectric layer so that the sidewalls of the conductive cap layer are in direct contact with the second dielectric layer. A third dielectric layer is selectively positioned over the second dielectric layer so that the top surface of the conductive cap layer is lower than a top surface of the third dielectric layer. In some embodiments, the height difference mentioned above between the conductive cap layer and the third dielectric layer provides a self-alignment for a subsequently formed via structure.

In the disclosed device, a fourth dielectric layer is arranged over the plurality of conductive structures and the third dielectric layer. An interconnect structure is further posited in the fourth dielectric layer. The interconnect structure includes a trench structure and a via structure that is positioned below the trench structure and connected to the trench structure. The via structure has a first portion positioned over the conductive cap layer so that sidewalls of the first portion are in direct contact with the third dielectric layer, and a second portion disposed over the first portion and the third dielectric layer. In the disclosed device, the height difference between the conductive cap layer and the third dielectric layer, and the etch selectivity between the third dielectric layer and the fourth dielectric layer provides the self-alignment between the via structure and the conductive cap layer.

According to yet another aspect of the disclosure, a first conductive structure is formed in a first dielectric layer, where the first conductive structure extends into the first dielectric layer from a top surface of the first dielectric layer. A conductive cap layer is selectively disposed over the conductive structure with a top surface and sidewalls. Further, a dielectric stack is selectively disposed over the first dielectric layer. The dielectric stack is in direct contact with the sidewalls of the conductive cap layer, and a top surface of the dielectric stack is higher than the top surface of the conductive cap layer. The disclosed device also includes a second conductive structure that is formed over the first conductive structure. The second conductive structure has a first portion positioned over the conductive cap layer so that sidewalls of the first portion are in direct contact with the dielectric stack, and a second portion disposed over the first portion and the dielectric stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
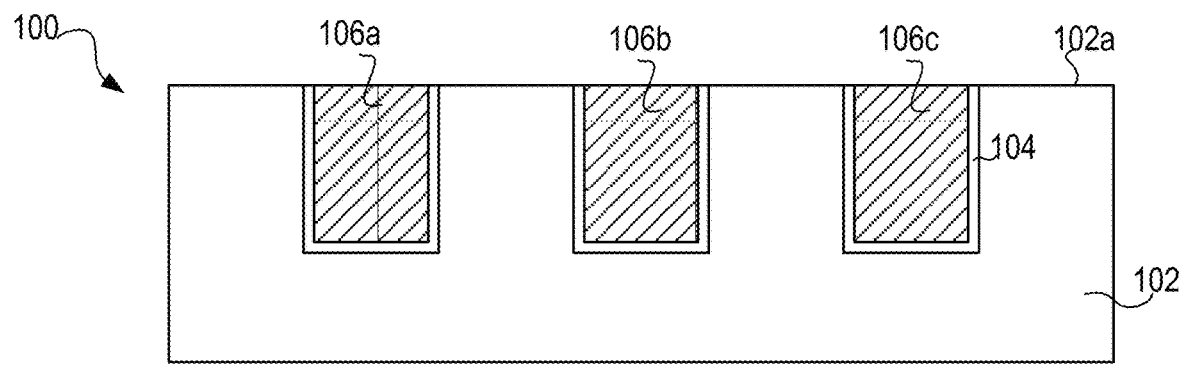
FIGS. 1-6 are cross-sectional views of various intermediate steps of manufacturing an interconnect structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques disclosed herein include methods of patterning substrates such as for back end of line (BEOL) metallization processes. Techniques disclosed herein enable fully self-aligned vias and lines, which includes using selective growth of bilayer dielectrics to enable self-alignment of trench and via patterning without using etch-stop layers or films with undesirable compositions. In the disclosed bilayer dielectric structures, a first dielectric layer can provide electric isolation from adjacent conductive components, such as metal lines, while a second dielectric layer can prevent etching of the first dielectric during the formation of the trench and via patterns. Both the first and second dielectric layers can be deposited in a same chamber and remain on the substrate within a wiring layer (also referred to as a dielectric layer) instead of being removed like most etch-stop layers.

Related techniques to provide self-alignment of conductive structures have some challenges. For example, one related technique provides self-alignment of conductive structures by recessing copper lines and vias below a top surface of surrounding dielectric material. Such a copper recessing can introduce significant integration issues (e.g., edge placement error) and bring potential contamination issues. In the disclosed techniques, instead of recessing a metal line, one or more dielectric layers can be introduced that surround an underlying conductive structure through a vertically deposited/regrown process to help provide a self-alignment between the underlying conductive structure and a overlying conductive structure. In some embodiments, the one or more selectively deposited dielectric layers can include two layers that are made of two different dielectric materials. For example, the selectively deposited dielectric layers can include a silicon dioxide structure with a relatively thin, metal oxide cap. Both the bilayer oxide (e.g., $SiO_2$ and metal oxide) layers can be deposited in situ in a same processing chamber or in a same tool/platform. In the disclosed techniques, via CD tolerances can be reduced by 10 nanometers.

As mentioned above, the metal oxide layer (i.e., the second dielectric layer) can function as a protection layer to prevent etching of the first dielectric layers that is disposed under the metal oxide layer during the formation of the trench and via patterns, where the first and second dielectric layers provide the self-alignment between the underlying conductive structure (e.g., a copper metal line, a tungsten contact, a copper via, and the like) and the trench and via patterns. In the related techniques, an etch stop layer is normally deposited above the underlying conductive structure. During the formation of the trench and via patterns, the etch stop layer needs to be removed. The removal of the etch stop layer can cause damage of the underlying conductive structure.

FIGS. 1-6 are cross-sectional views of various intermediate steps of manufacturing an interconnect structure. As shown in FIG. 1, a substrate 100 is provided (received, obtained, or otherwise fabricated). The substrate 100 has a plurality of conductive structures 106 that are made of a first conductive material. The conductive structures 106 can be formed within a first wiring layer (also referred to as a first dielectric layer) 102 that is made of a first dielectric material. For example, as shown in FIG. 1, three conductive structures 106a-106b are formed in the first wiring layer 102. The first wiring layer 102 defines a planar surface 102a that is uncovered (exposed or otherwise accessible) with which top surfaces of the conductive structures 106 are level so that the top surfaces of the conductive structures 106 are also uncovered. In other words, such a substrate can include a given first wiring layer 102 after copper fill and chemical-mechanical polishing to complete the conductive structures 106. The conductive structures 106 can be lines and/or vias. Thus, such a substrate 100 can be ready for fabricating an additional wiring layer or additional structure over the top surface 102a.

In some embodiments, the first wiring layer (or first dielectric layer) 102 can be a low-K film, a SiO layer, or other suitable dielectric layer. The conductive structures can be made of copper, ruthenium, tungsten, nickel, cobalt, or other suitable conductive materials. In some embodiments, a barrier layer 104 can be formed between the conductive structures 106 and the first wiring layer 102. The barrier layer 104 can be made of Ti, TiN, Ta, TaN, or other suitable materials.

Figure 2A:
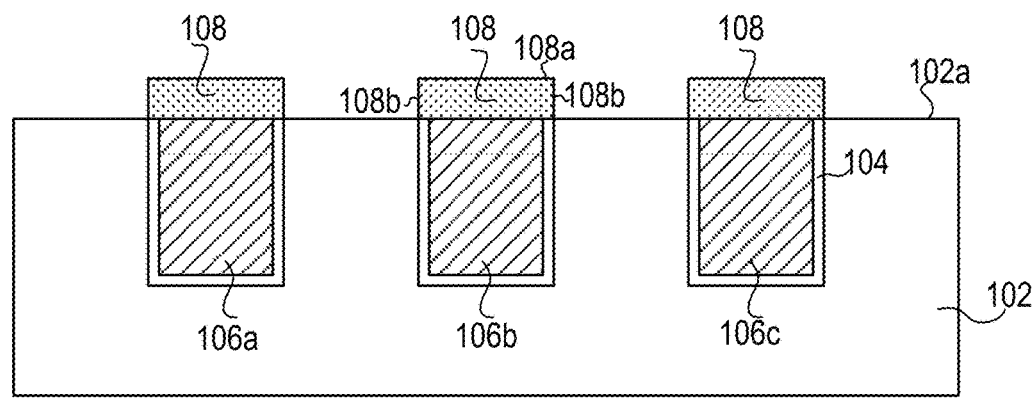

In FIG. 2A, a conductive cap layer (or metal cap) 108 can be selectively deposited on the uncovered top surfaces of the conductive structures 106 without being deposited on the top surface 102a of the first wiring layer 102. The conductive cap layer 108 can have a top surface 108a and sidewalls 108b. In some embodiments, the conductive cap layer can include, but are not limited to, ruthenium, cobalt, tungsten, and nickel.

Figure 2B:
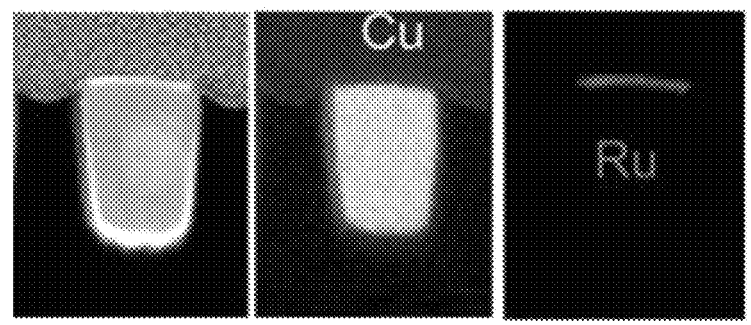

FIG. 2B are three images obtained through a scanning transmission electron microscopy (STEM) to illustrate an exemplary conductive cap layer. As shown in FIG. 2B, a left image illustrates a conductive structure and a conductive cap layer that is formed over the conductive structure based on the STEM. A middle image illustrates an elemental analysis data obtained from the conductive structure. The middle image shows that the conductive structure is made of copper. A right image illustrates another elemental analysis data obtained from the conductive cap layer. The right image shows that the conductive cap layer is a ruthenium layer. The conductive cap layer 108 can be made through a CVD process, a PVD process, a sputter process, a diffusion process, an atomic layer deposition process or other suitable deposition processes. An exemplary equipment that can form the conductive cap layer 108 can be illustrated in FIGS. 7-9.

Figure 3:
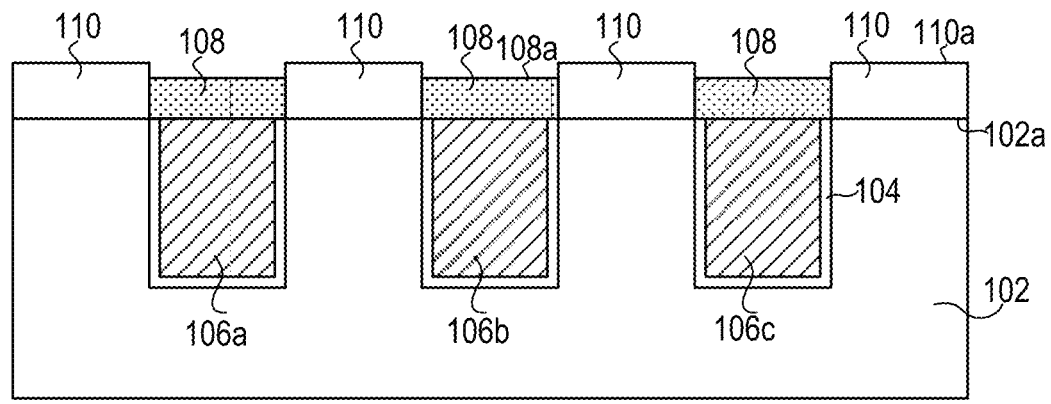

In FIG. 3, a second dielectric layer 110 is selectively grown/deposited on the uncovered top surface 102a of the first dielectric layer 102. Accordingly, the top surface 108a of the conductive cap layer 108 is exposed (or uncovered), and the sidewalls 108b of the conductive cap layer 108 are in direct contact with the second dielectric layer 110. In some embodiments, the sidewalls 108b of the conductive cap layer 108 are surrounded by the second dielectric layer 110. In some embodiment, the first and second dielectric layers can be made of a same material. For example, the first dielectric layer 102 is made of $SiO_2$, and the second dielectric layer 110 is also made of $SiO_2$. In some embodiments, the first and the second dielectric layers are made of different materials. For example, the first dielectric layer 102 is a low-k layer and the second dielectric layer 110 is a SiO layer. In some embodiment, the second dielectric layer 110 can have a thickness in a range from 3 nm to 15 nm. A k-value of the second dielectric layer 110 can be less than 4. Of course, other suitable k-values can be applied according to the circuit design requirements.

In some embodiments, a top surface 110a of the second dielectric layer 110 can be higher than the top surface 108a of the conductive cap layer 108. In some embodiments, the top surface 110a of the second dielectric layer 110 can be lower than the top surface 108a of the conductive cap layer 108 according to the deposition process. The second dielectric layer 110 can be made through a CVD process, a PVD process, a sputter process, a diffusion process, an atomic layer deposition process or other suitable deposition processes. An exemplary equipment that can form the second dielectric layer 110 can be illustrated in FIGS. 7-9.

Figure 4:
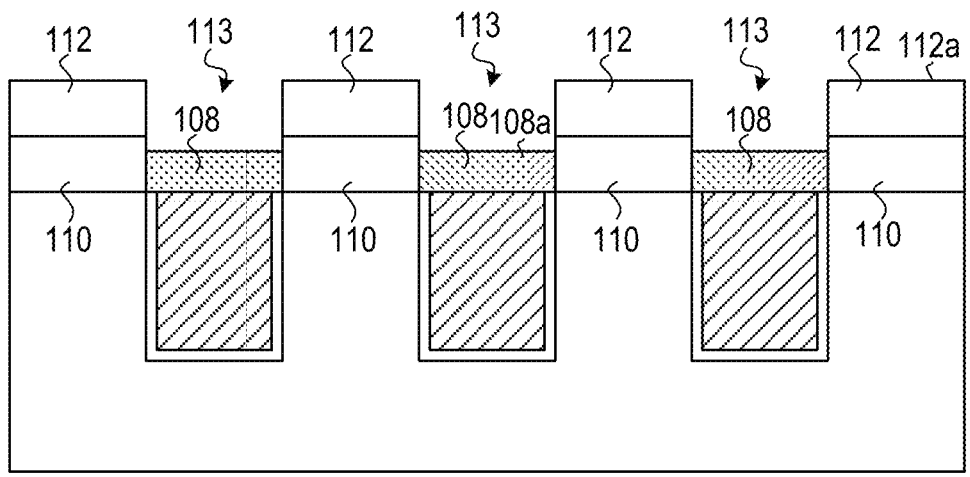

As shown in FIG. 4, after the second dielectric layer 110 is selectively deposited, a third dielectric layer 112 can be selectively grown on the second dielectric layer 110. Accordingly, the top surface 108a of the conductive cap layer 108 is still exposed or uncovered, and is lower than a top surface 112a of the third dielectric layer 112. In addition, a plurality of recess regions 113 can be formed in the third dielectric layer 112. The recess regions 113 can have sidewalls that expose the third dielectric layers 112. In some embodiments, the sidewalls of the recess regions 113 can further expose a portion of the second dielectric layers 110. The recess regions 113 can have a bottom portion that expose the conductive cap layer 108.

In some embodiments, the third dielectric layer 112 can have an etch resistivity that differs from an etch resistivity of the second dielectric layer 110. The third dielectric layer 112 can have a thickness between 1 nm and 5 nm. The third dielectric layer 112 can be made of a metal-containing dielectric or metal oxide, such as $Al_2O_3$, $HfO_2$, $ZrO_2$, $TiO_2$, and combinations thereof. In some embodiments, the third dielectric layer 112 can be a non-metal containing dielectric, such as SiC or SiCN, that has an etch selectivity to the fourth dielectric layer such that an etching plasma can remove the fourth dielectric layer faster than remover the third dielectric layer. The third dielectric layer 112 can be relatively thin as compared to the second dielectric layer 110. For example, a height of the second dielectric layer can be at least twice as great as a height of the third dielectric layer. Of course, the second and third dielectric layers can have other thickness ratios according to different manufacturing conditions.

Figure 5:
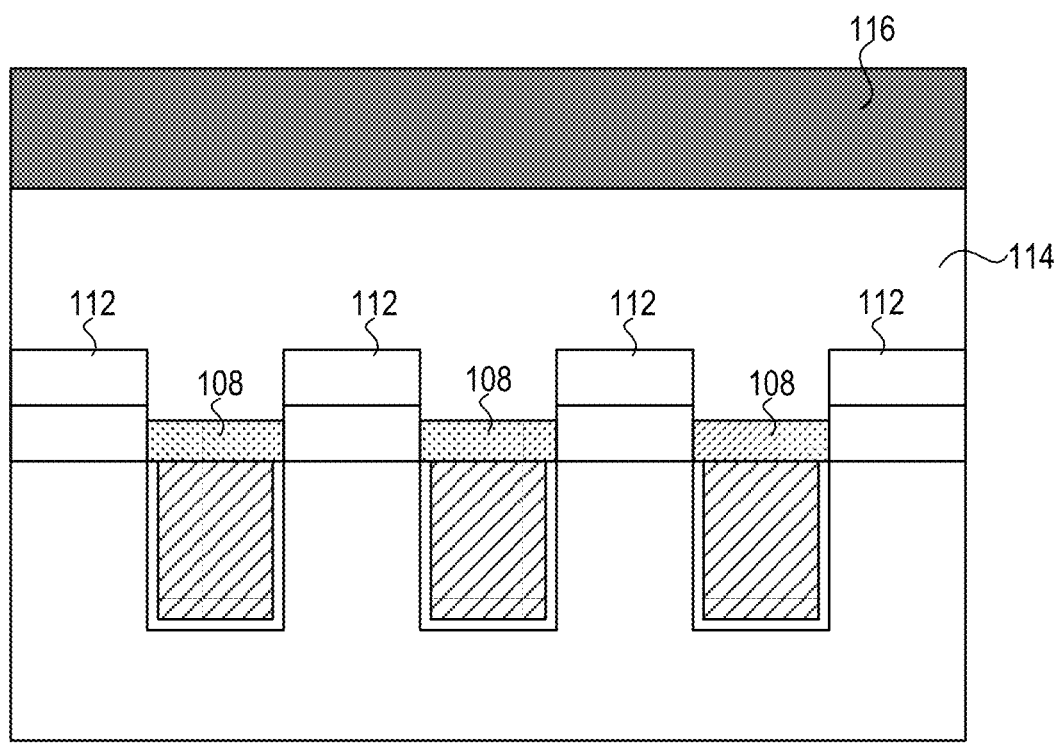

In FIG. 5, a second wiring layer (also referred to as fourth dielectric layer) 114 is formed over the third dielectric layer 112 and the conductive cap layer 108 so that the recess regions 113 are filled by the second wiring layer 114. The second wiring layer 114 is made of a fourth dielectric material, such as a low-K material, $SiO_2$, or other suitable dielectric materials. As shown in FIG. 5, the fourth dielectric layer 114 can cover the second and third dielectric layers and the conductive cap layer, and provide a planar top surface. In other words, the substrate 100 can be coated with the fourth dielectric layer 114 in order to form additional metal layer in the subsequent steps. Typically, integrated circuits can have a number of wiring layers, such as 10-20 wiring layers. After one wiring layer is completed (usually after metallization and planarization of a given layer), a next wiring layer can be created.

Still referring to FIG. 5, a hard mask layer 116 can be formed over the fourth dielectric layer 114. The hard mask layer 116 can be a single layer, such as a TiN layer, or include multiple layers. On top of the hard mask layer, a photoresist layer (not shown) can be deposited and patterned through a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. Patterns formed in the photoresist can be subsequently transferred by an etching process into the hard mask layer, and further into portions of the second wiring layer 114 to form one or more interconnect openings (not shown). Each of the interconnect openings can have a trench opening and/or via opening for subsequent metallization to form one or more interconnect structures, such as one or more dual damascene structures.

Figure 6:
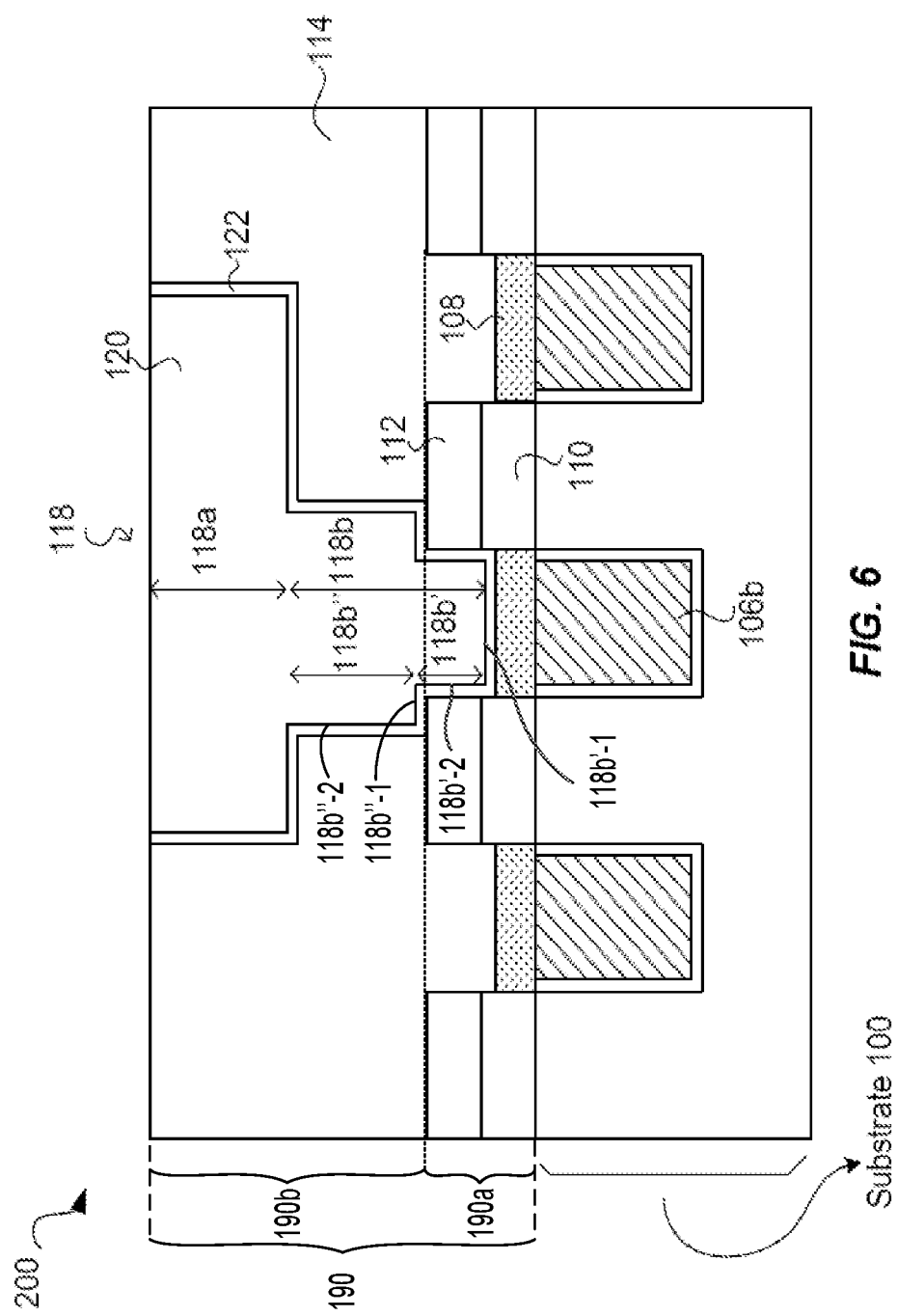

In FIG. 6, after the interconnect openings (not shown) are formed within the second wiring layer (or fourth dielectric layer) 114, the interconnect openings formed therein can be metallized, that is, filled with a conductive material 120. The conductive material 120 can be copper, tungsten, ruthenium, cobalt, or other suitable materials. Such a metallization can include depositing a liner (or barrier layer) 122 followed by depositing the bulk conductive material 120. The bulk conductive material 120 can further cover a top surface of the fourth dielectric layer 114. A surface planarization process, such as a CMP process, can be applied to remove excessive conductive material 120 from the top surface of the fourth dielectric layer. The conductive material 120 that remains in the interconnect openings become the interconnect structures. The liner 122 can be made of Ti, TiN, Ta, Ta, or other suitable materials.

Still referring to FIG. 6, an inverted rectangular stair-shaped interconnect structure 118 is formed in the fourth dielectric layer 114. The inverted rectangular stair-shaped interconnect structure 118 can have a trench structure 118a and a via structure 118b that is positioned below the trench structure and connected to the trench structure. The via structure 118b can have a first portion 118b' and a second portion 118b''. The first portion 118b' of the via structure has a first tread 118b'-1 that is positioned over the conductive cap layer 108, and a first riser 118b'-2 or sidewalls of the first portion 118b' that are perpendicular to the first tread 118b'-1 and are in direct contact with the third dielectric layer 112. In some embodiments, the first riser 118b'-2 or sidewalls of the first portion 118b' are surrounded by the third dielectric layer 112. In some embodiments, the first riser 118b'-2 or sidewalls of the first portion 118b' are also in direction contact with a portion of the second dielectric layer 110 based on the process conditions. The second portion 118b" is disposed over the first portion 118b'. The second portion 118b" can have a second tread 118b"-1 that is positioned on the third dielectric layer 112 and in direct contact with the third dielectric layer 112, and a second riser 118b"-2 being perpendicular to the second tread 118b"-1 and surrounded by the fourth dielectric layer 114. The interconnect structure 118 is electrically coupled to the conductive structure 106b through the via structure 118b. In an embodiment, the second dielectric layer 110, the third dielectric layer 112 and the fourth dielectric layer 114 can be made of a same dielectric material, and are collectively defined as a dielectric stack 190. In some embodiments, the dielectric stack 190 can have a first portion 190a surrounding the first riser 118b'-2 of the first portion 118b' of the via structure 118b and having a top surface being co-planer with a top surface of the first portion 118b' of the via structure 118b, and a second portion 190b positioned over the first portion 190a and surrounding the second riser 118b"-2 of the second portion 118" of the via structure 118b.

Once the interconnect structure 118 is formed, a semiconductor device 200 is completed. The semiconductor device 200 has a substrate 100. The substrate 100 has the conductive structures 106 formed in the first dielectric layer 102. Over the conductive structures 106, the conductive cap layer 108 is selectively positioned. The second dielectric layer 110 is selectively disposed over the first dielectric layer 102 so that the sidewalls of the conductive cap layer 108 are surrounded by the second dielectric layer 110. The third dielectric layer 112 is formed selectively over the second dielectric layer 110 so that the top surface of the third dielectric layer 112 is above the top surface of the conductive cap layer 108. Further, the interconnect structure 118 is formed. The interconnect structure 118 is electrically coupled to one of the conductive structures 106b through the via structure of the interconnect structure.

In the disclosed semiconductor device 200, the selectively grown bilayer dielectric (e.g., the first and second dielectric layers) provides a self-alignment between the via structure (e.g., 118b) and the underlying conductive structure (e.g., 106b) and a protection from capacitance issues that are driven by a misalignment. For example, even if a corresponding lithography pattern (e.g., the via opening) is not registered perfectly to align with an intended metal line (e.g., the conductive structure 106b), the bilayer dielectric can guide the via opening to the intended underlying metal line (e.g., the conductive structure 106b) or other conductive structure because the third dielectric layer has a lower etch rate comparing to the fourth dielectric layer. In the disclosed semiconductor device 200, a height of the bilayer dielectric is more than a height of the conductive cap layer, which can prevent the via structure 118b from overlapping any adjacent conductive structures and provide a sufficient distance between the via structure 118b and adjacent underlying conductive structures to prevent defects, such as electrical shorts.

In the disclosed method, the first, second, and fourth dielectric layers can be made of a same dielectric material.

In other embodiments, the first dielectric layer can be made of ultra low-K material, the second dielectric layer can be made of silicon oxide, the third dielectric layer can be made of metal oxide, and the fourth dielectric layer can be an ultra low-K film. Accordingly, a SiCN etch stop layer is not needed over the active metal (e.g., the conductive structures 106) and the ultra low-k material (e.g., the fourth dielectric layer 114) can be formed over an underlying metal layer (e.g., the conductive structures 106)/wiring layer (e.g., the first dielectric layer). In the disclosed method, the introduced bilayer dielectric and the introduced conductive cap layer only result in an approximately 1-2% increase in self-capacitance (parasite capacitance). But the via resistance can be reduced by more than 5% through allowing a via size to be increased given that the first portion of the via structure can be self-aligned to the underlying conductive structures and the second portion of the via has an increased via size than the first portion to reduce the via resistance. Thus techniques herein provide a benefit to reduce defectivity (e.g., misalignment) with minimal effect on performance.

The disclosed method also provides a benefit of throughput. The disclosed method can be implemented within a common platform or common tool, where different chambers are used for metal cap deposition and dielectric layer deposition respectively, and all corresponding modules can be connected to a single platform or wafer serving system. In other embodiments, a same chamber can be used for depositing both dielectric materials.

Figure 7:
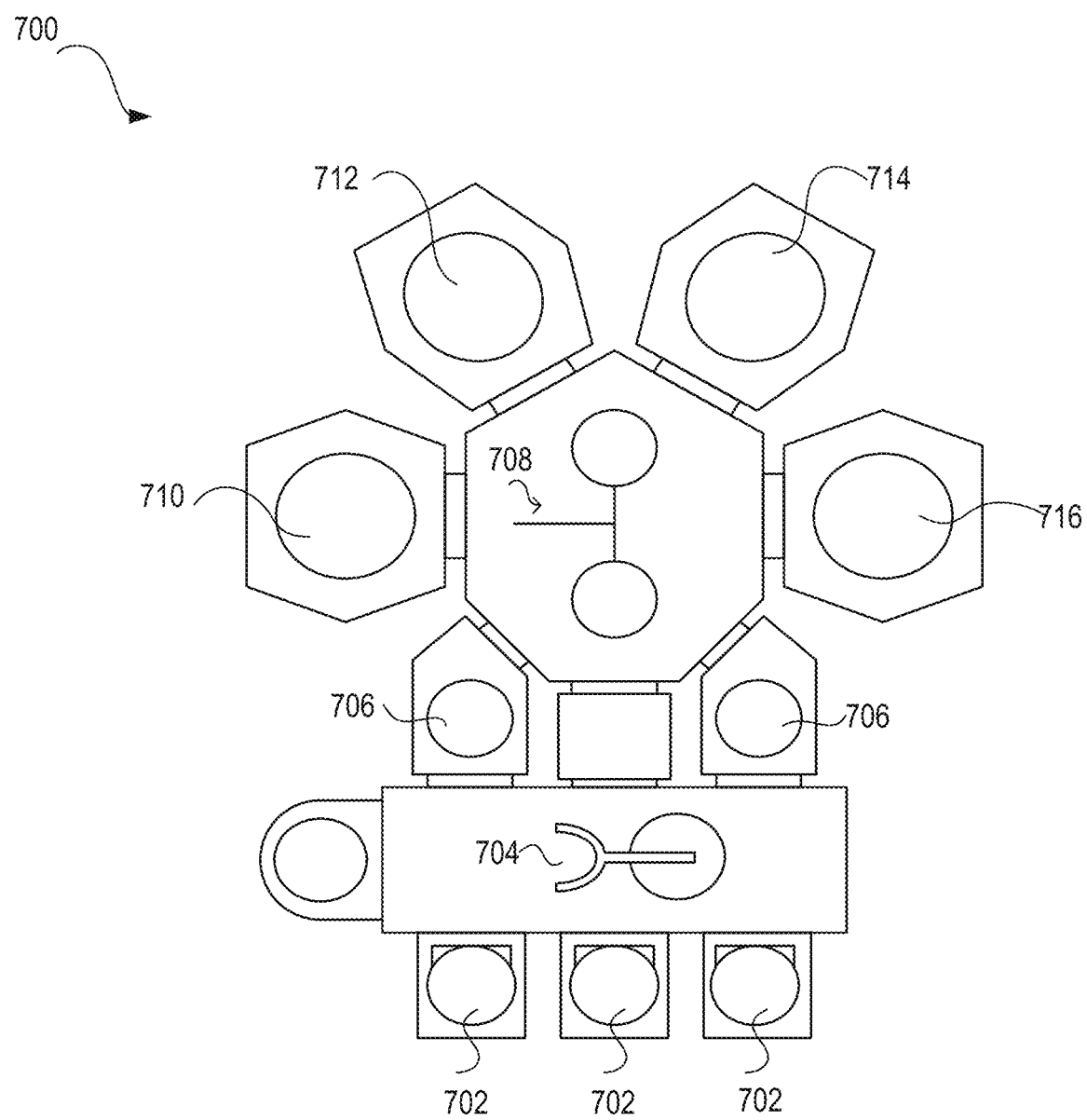
FIG. 7 is a schematic view of a first semiconductor equipment configured to form an interconnect structure, in accordance with some embodiments.

FIG. 7 is schematic view of a first semiconductor equipment 700 configured to form an interconnect structure, in accordance with some embodiments of the present disclosure. As shown in FIG. 7, the equipment 700 can provide a chemical vapor deposition (CVD) process. The equipment 700 can include a plurality of wafer load ports 702 configured to receive wafers, and a wafer handler 704 configured to transport the wafers from the wafer load ports to the load locks 706. The load locks 706 function as secondary vacuum chambers to house wafers and further transfer the wafers to processing chambers. The equipment 700 also includes a plurality of processing chambers 710-716 and a wafer transfer mechanism 708 configured to transfer the wafers between the processing chambers.

The equipment 700 can include a first processing chamber 710 configured to deposit the conductive cap layer, such as ruthenium, and a treatment chamber 712 configured to remove surface oxide on the conductive structures through a plasma process or a $H_2O$ vapor process. The treatment chamber 712 can also provide an annealing process, and a deposition of a self-alignment monolayer (SAM) that helps selective growths of the conductive cap layer, the second dielectric layer and the third dielectric layer. The equipment 700 further includes a second deposition chamber 714 configured to form the second dielectric layer that can be made of SiO, and a third deposition chamber 716 configured to form the third dielectric layer that can be made of metal oxide.

An exemplary deposition process based on the equipment 700 to form the SiO can involve in applying processing gases of $SiH_4$ and $N_2O$, a processing temperature between 300° C. and 400° C., and a processing pressure between 2 and 3 Torr. An exemplary deposition process to form the ruthenium can involve in introducing Ru CVD precursors into the first processing chamber 710 and a processing temperature between 400° C. and 600° C. The Ru CVD precursors include $Ru(acac)_3$ (acac also referred to as acetylacetinate), $Ru(EtCp)_2$ (EtCp also referred to as ethylcyclopentadienyl), $Ru_3(CO)_{12}$, or the like.

Figure 8:
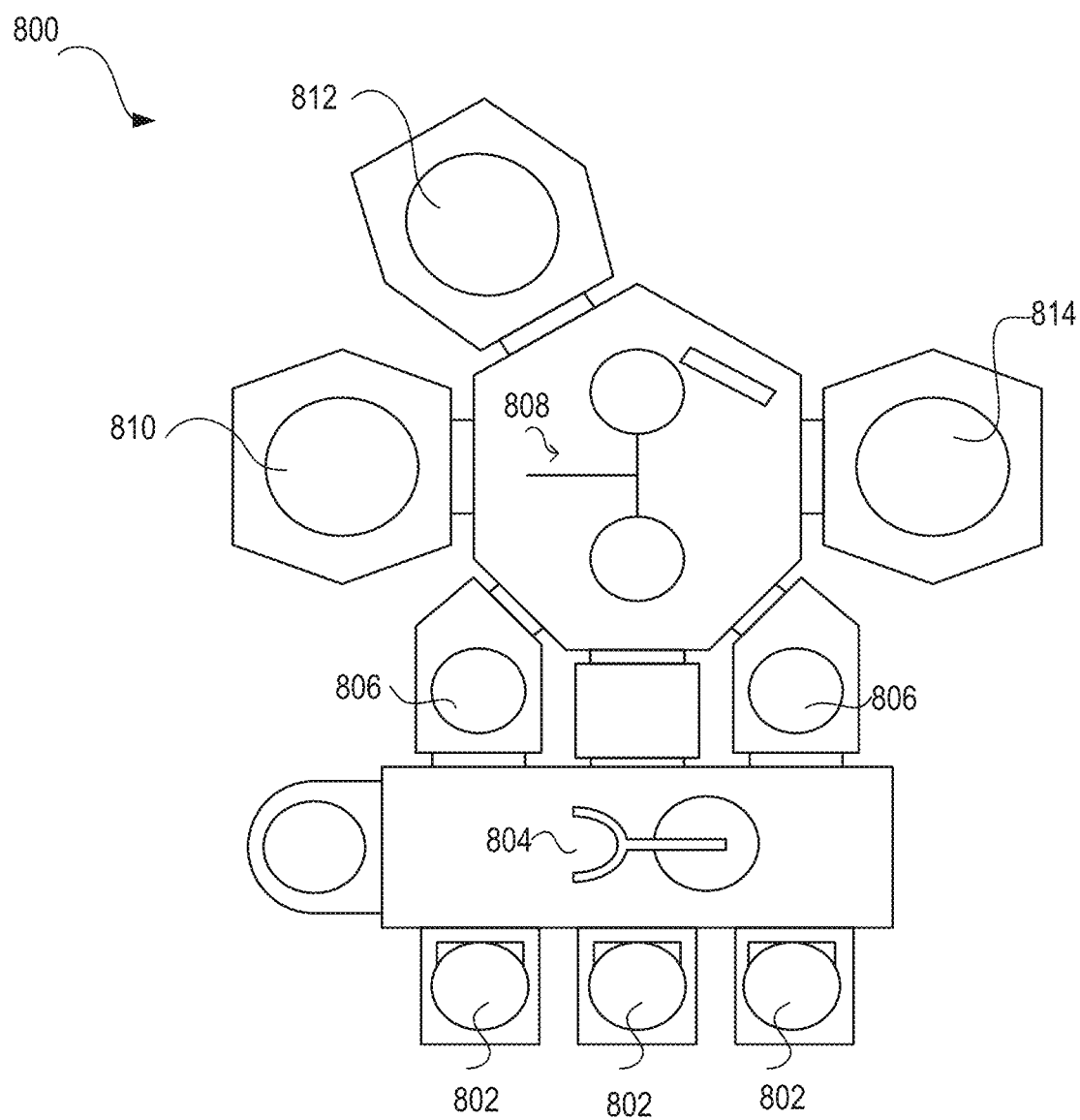
FIG. 8 is a schematic view of a second semiconductor equipment configured to form an interconnect structure, in accordance with some embodiments.

FIG. 8 is a schematic view of a second semiconductor equipment 800 configured to form an interconnect structure, in accordance with some embodiments of the present disclosure. As shown in FIG. 8, the semiconductor equipment 800 can include a plurality of wafer load ports 802, a wafer handler 804, one or more load locks 806, a plurality of processing chambers 810-814, and a wafer transfer mechanism 808. The processing chambers include a first processing chamber 810 configured to form a metal layer, such as the conductive cap layer, a treatment chamber 812 that has a similar function as the treatment chamber 712 mentioned above, and a second processing chamber 814. Comparing to the equipment 700, the second processing chamber 814 can produce a SiO dielectric layer and a metal oxide layer in situ. In other words, the second processing chamber 814 can form a SiO layer at first and then form a metal oxide layer subsequently.

Figure 9:
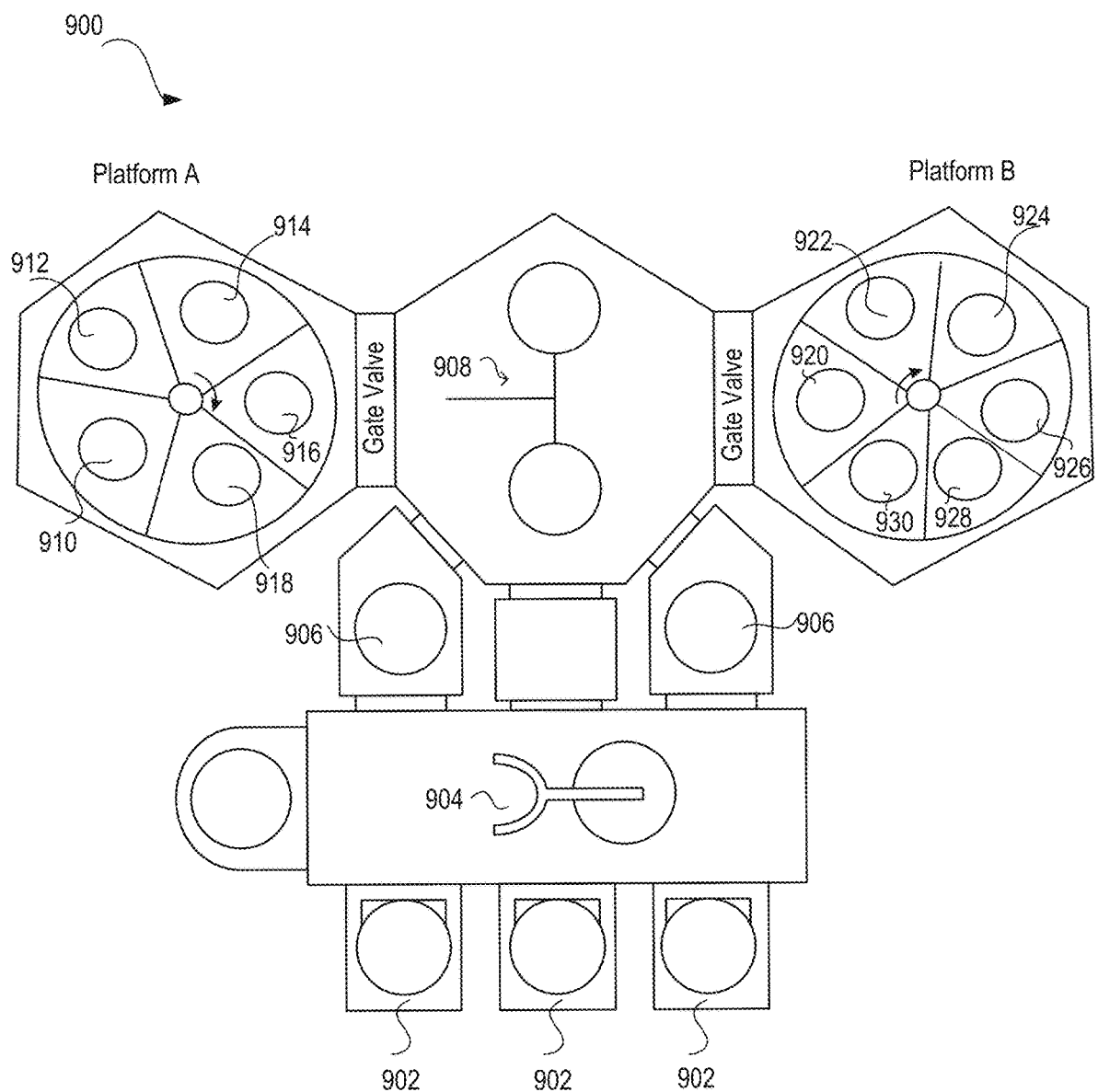
FIG. 9 is a schematic view of a third semiconductor equipment configured to form an interconnect structure, in accordance with some embodiments.

FIG. 9 is a schematic view of a third semiconductor equipment 900 configured to form an interconnect structure, in accordance with some embodiments of the present disclosure. Comparing to the equipment 700 or 800, the equipment 900 can provide a more concise layout and a higher throughput. As shown in FIG. 9, the equipment 900 can includes a plurality of wafer load ports 902, a wafer handler 904, one or more load locks 906 and two platforms A and B. The platform A is configured to perform deposition of metal and treatment. The platform A includes a first chamber 910 configured to operate metal deposition, a first purge chamber 912 to purge out pre-cursor from a previous step, a plasma treatment chamber 914 configured to operate plasma treatment, such as Ar or H$_2$ plasma treatment to remove surface oxide from the conductive structures, a second purge chamber 916, and a treatment chamber 918. The treatment chamber can operate annealing, or form a self-alignment monolayer.

The platform B of the equipment 900 is configured to produce the dielectric layers. For example, the platform B has a first preparation chamber 920 that is configure to form a first dielectric material, a first purge chamber 922 configured to purge the pre-cursor from the previous step, a second preparation chamber 924 configured to produce a second dielectric material, a second purge chamber 926, a third preparation chamber 928 configured to produce a third dielectric material, and a third purge chamber 930.

In an exemplary manufacturing process, a wafer can be sent to the platform A. The wafer can receive a plasma treatment to remove surface oxide on top surfaces of the underlying conductive structures (e.g., conductive structures 106) in the plasma treatment chamber 914. The wafer is then sent to the second purge chamber 916 to remove residual of the processing gas from plasma treatment chamber 914. The wafer can then receive a metal layer deposition, such as Ru deposition in the first chamber 910, and then be sent to the first purge chamber 922 to remove the Ru CVD pre-cursor. The wafer is then sent to the platform B through the wafer transfer mechanism 908. In platform B, the wafer can receive a first dielectric material (e.g., the second dielectric layer) in the first preparation chamber 920, and then be sent to the first purge chamber 922 to remove the CVD pre-cursor from formation of the first dielectric material. The wafer is then sent to the second preparation chamber 924 to receive a second dielectric material (e.g., the third dielectric layer). The wafer is then transferred to the second purge chamber 926 to remove the pre-cursor from formation of the second dielectric material. The wafer is further sent to the third preparation chamber 928 to receive the third dielectric material (e.g., the fourth dielectric layer), and is subsequently sent to the third purge chamber 930 to remove the pre-cursor from formation of the third dielectric material.

Figure 10:
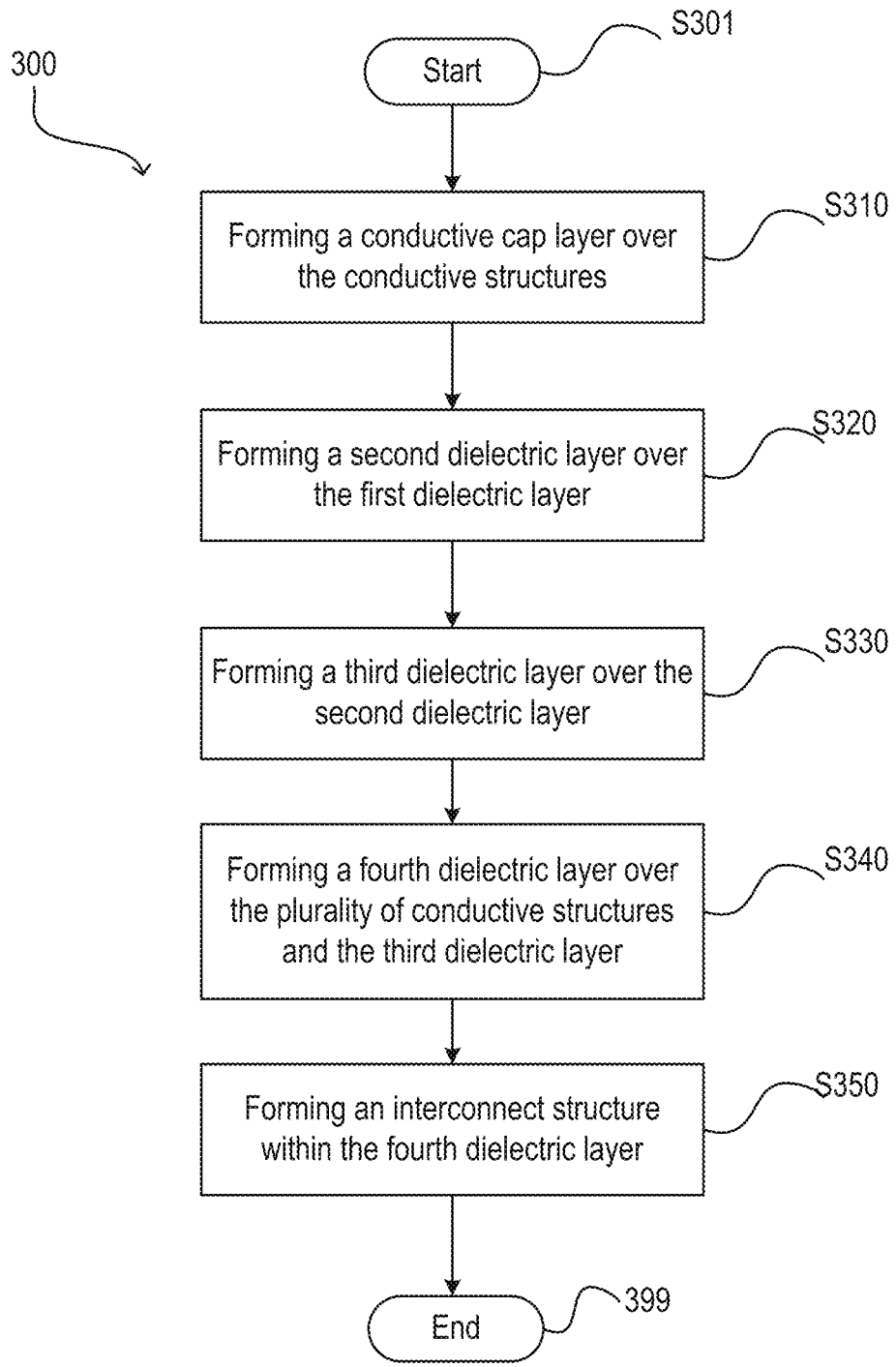
FIG. 10 is a flowchart of a process for manufacturing an interconnect structure, in accordance with some embodiments.

FIG. 10 is a flowchart of a process 300 for manufacturing an interconnect structure. The process 300 begins at step 310 where a conductive cap layer is selectively formed over a plurality of conductive structures. The conductive structures are formed in a first dielectric layer, where a top surface of the first dielectric layer is level with top surfaces of the conductive structures. In some embodiments, steps 310 can be performed as illustrated with reference to FIGS. 1, 2A and 2B.

The process 300 then proceeds to step 320 where a second dielectric layer is formed over the first dielectric layer. The second dielectric layer is selectively positioned over the first dielectric layer so that the top surface of the conductive cap layer is exposed or uncovered, and the sidewalls of the conductive cap layer are surrounded by the second dielectric layer. In some embodiments, step 320 can be performed as illustrated with reference to FIG. 3.

The process 300 proceeds to step 330 where a third dielectric layer is formed over the second dielectric layer. The third dielectric layer is selectively positioned over the second dielectric layer so that the top surface of the conductive cap layer is exposed or uncovered, and is lower than a top surface of the third dielectric layer. In some embodiments, steps 330 can be performed as illustrated with reference to FIG. 4.

In step 340 of the process 300, a fourth dielectric layer is formed over the plurality of conductive structures and the third dielectric layer. In some embodiments, step 340 can be performed as illustrated with reference to FIG. 5.

The process 300 then proceeds to step 350, where an interconnect structure is formed within the fourth dielectric layer. The interconnect structure includes a via structure that has a first portion positioned over the conductive cap layer so that sidewalls of the first portion are surrounded by the third dielectric layer, and a second portion disposed over the first portion and the third dielectric layer. In some embodiments, step 350 can be performed as illustrated with reference to FIG. 6.

It should be noted that additional steps can be provided before, during, and after the process 300, and some of the steps described can be replaced, eliminated, or performed in different order for additional embodiments of the process 300. In subsequent process steps, various additional interconnect structures (e.g., metallization layers having conductive lines and/or vias) may be formed over the semiconductor device 200. Such interconnect structures electrically connect the semiconductor device 200 with other contact structures and/or active devices to form functional circuits. Additional device features such as passivation layers, input/output structures, and the like may also be formed.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
   a plurality of conductive structures formed in a first dielectric layer, top surfaces of the plurality of the conductive structures and a top surface of the first dielectric layer being co-planar;
   a conductive cap layer selectively positioned over the conductive structures and the first dielectric layer with a top surface and sidewalls;
   a second dielectric layer selectively positioned over the first dielectric layer and disposed between the sidewalls of the conductive cap layer so that the sidewalls of the conductive cap layer are surrounded by the second dielectric layer and the top surface of the conductive cap layer is uncovered by the second dielectric layer;
   a third dielectric layer selectively positioned over the second dielectric layer and disposed between the sidewalls of the conductive cap layer so that the top surface of the conductive cap layer is lower than a top surface of the third dielectric layer and uncovered by the third dielectric layer;
   a fourth dielectric layer arranged over the plurality of conductive structures and the third dielectric layer; and
   an inverted rectangular stair-shaped interconnect structure formed in the fourth dielectric layer, the inverted rectangular stair-shaped interconnect structure including a trench structure and a via structure that is positioned below the trench structure and connected to the trench structure, the via structure having a first portion that has a first tread positioned over the conductive cap layer and a first riser being perpendicular to the first tread and surrounded by the third dielectric layer, and a second portion that has a second tread disposed over the third dielectric layer and a second riser being perpendicular to the second tread and surrounded by the fourth dielectric layer.

2. The semiconductor device of claim 1, wherein the second portion of the via structure is disposed between the trench structure and the first portion of the via structure, and has a larger critical dimension than the first portion of the via structure so as to reduce a via resistance of the via structure.

3. The semiconductor device of claim 1, wherein the first portion of the via structure is electrically coupled to the one of the plurality of conductive structures.

4. The semiconductor device of claim 1, wherein the conductive cap layer comprises at least one of ruthenium, tungsten, nickel, or cobalt.

5. The semiconductor device of claim 1, wherein a height of the second dielectric layer is at least twice as great as a height of the third dielectric layer.

6. The semiconductor device of claim 1, wherein the third dielectric layer is made of metal-containing dielectric material.

7. The semiconductor device of claim 2, wherein the critical dimensions of the first portion and the second portion are constant.

8. The semiconductor device of claim 1, wherein the second dielectric layer and the third dielectric layer have different etch resistivities.

9. A semiconductor device, comprising:
   a first conductive structure formed in a first dielectric layer, the first conductive structure extending into the first dielectric layer from a top surface of the first dielectric layer;
   a conductive cap layer selectively disposed over the first conductive structure and the first dielectric layer with a top surface and sidewalls;
   a dielectric stack selectively disposed over the first dielectric layer and arranged between the sidewalls of the conductive cap layer, the sidewalls of the conductive cap layer being surrounded by the dielectric stack, a top surface of the dielectric stack being higher than the top surface of the conductive cap layer, the top surface of the conductive cap layer being uncovered by the dielectric stack; and
   an inverted rectangular stair-shaped second conductive structure formed over the first conductive structure, the inverted rectangular stair-shaped second conductive structure having a trench portion and a via portion that is positioned below and coupled to the trench portion, the via portion including a first portion that has a first tread positioned over the conductive cap layer and a first riser being perpendicular to the first tread and surrounded by a first portion of the dielectric stack, a top surface of the first portion of the dielectric stack being co-planer with a top surface of the first portion of the via portion, and a second portion that has a second tread disposed over the first portion of the dielectric stack and a second riser being perpendicular to the second tread and surrounded by a second portion of the dielectric stack that is positioned over the first portion of the dielectric stack, the second portion of the second conductive structure having a larger critical dimension than the first portion of the second conductive structure so as to reduce a resistance of the second conductive structure.

10. The semiconductor device of claim 9, wherein the dielectric stack comprises a second dielectric layer disposed over the first dielectric layer, and a third dielectric layer positioned over the second dielectric layer.

11. The semiconductor device of claim 10, wherein a height of the second dielectric layer is at least twice as great as a height of the third dielectric layer.

12. The semiconductor device of claim 9, wherein the critical dimensions of the first portion and the second portion are constant.

\* \* \* \* \*